(12) United States Patent
He

(10) Patent No.: US 12,207,443 B2
(45) Date of Patent: Jan. 21, 2025

(54) LOW-NOISE HEAT EXCHANGER

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 237 days.

(21) Appl. No.: 17/812,855

(22) Filed: Jul. 15, 2022

(65) Prior Publication Data

US 2024/0023283 A1 Jan. 18, 2024

(51) Int. Cl.
| | |
|---|---|
| H05K 7/20 | (2006.01) |
| H01L 23/367 | (2006.01) |
| H01L 23/427 | (2006.01) |
| H01L 23/467 | (2006.01) |

(52) U.S. Cl.
CPC ....... H05K 7/2039 (2013.01); H01L 23/3672 (2013.01); H01L 23/427 (2013.01); H01L 23/467 (2013.01); H05K 7/20154 (2013.01); H05K 7/20336 (2013.01)

(58) Field of Classification Search
CPC ........... H05K 7/20154; H05K 7/20336; H05K 7/2039; H01L 23/3672; H01L 23/427; H01L 23/467
See application file for complete search history.

(56) References Cited

U.S. PATENT DOCUMENTS

| | | | | |
|---|---|---|---|---|
| 6,181,556 | B1 * | 1/2001 | Allman | G06F 1/20 |
| | | | | 174/16.3 |
| 6,598,666 | B2 * | 7/2003 | Lin | H01L 23/4093 |
| | | | | 257/722 |
| 7,019,969 | B2 * | 3/2006 | Foster, Sr. | H01L 23/467 |
| | | | | 257/722 |
| 7,661,461 | B2 * | 2/2010 | Chen | F28D 15/00 |
| | | | | 165/104.33 |
| D660,256 | S * | 5/2012 | Yoon | D13/179 |
| 10,371,457 | B2 * | 8/2019 | Chen | F28D 15/0275 |
| 2020/0068745 | A1 * | 2/2020 | Lin | H05K 7/20336 |

FOREIGN PATENT DOCUMENTS

| | | | | |
|---|---|---|---|---|
| CN | 203588992 | U | * | 5/2014 |
| CN | 207780702 | U | * | 8/2018 |
| CN | 210465614 | U | * | 5/2020 |
| TW | M280096 | U | * | 11/2005 |
| TW | M285746 | U | * | 1/2006 |
| TW | M306681 | U | * | 2/2007 |
| TW | M316616 | U | * | 8/2007 |

* cited by examiner

Primary Examiner — Robert J Hoffberg

(74) Attorney, Agent, or Firm — McDermott Will & Emery LLP

(57) ABSTRACT

In one or more embodiments, one or more systems comprise a heat exchanger comprising a first heat sink coupled to a first portion of a set of heat pipes, a first fan for generating a first airflow in a first direction through the first heat sink, a second heat sink coupled to a second portion of the set of heat pipes and a second fan for generating a second airflow in a second direction through the second heat sink, wherein the first heat sink is separated from the second heat sink by a gap with a distance configured to thermally isolate the first heat sink and the second heat sink and the first direction is opposite the second direction. The heat exchanger may be oriented such that the first fan and the second fan generate airflows perpendicular to a main airflow.

11 Claims, 11 Drawing Sheets

LOW-NOISE HEAT EXCHANGER

BACKGROUND

Field of the Disclosure

This disclosure relates generally to information handling systems and more particularly to heat exchangers for cooling heat-generating components.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may be directed to a heat exchanger comprising a first heat sink coupled to a first portion of a set of heat pipes, a first fan for generating a first airflow in a first direction through the first heat sink, a second heat sink coupled to a second portion of the set of heat pipes and a second fan for generating a second airflow in a second direction through the second heat sink, wherein the first heat sink is separated from the second heat sink by a gap with a distance configured to thermally isolate the first heat sink and the second heat sink and the first direction is opposite the second direction.

In one or more embodiments, one or more systems, one or more methods, and/or one or more processes may be directed to a chassis for an information handling system comprising at least one heat-generating component. In some embodiments, the chassis comprises a main fan for generating a main airflow in a main airflow direction from an intake to a vent and a heat exchanger for cooling the at least one heat-generating component. In some embodiments, the heat exchanger comprises a first heat sink coupled to a first portion of a set of heat pipes, a first fan for generating a first airflow in a first direction through the first heat sink, a second heat sink coupled to a second portion of the set of heat pipes and a second fan for generating a second airflow in a second direction through the second heat sink. In some embodiments, the first heat sink is separated from the second heat sink by a gap with a distance configured to thermally isolate the first heat sink and the second heat sink. In some embodiments, the first direction is opposite the second direction.

In one or more embodiments, one or more systems, one or more methods, and/or one or more processes may be directed to an information handling system comprising a chassis having an intake and a vent, a plurality of components in the chassis, a main fan for generating a main airflow in a main airflow direction in the chassis and a heat exchanger for cooling the at least one heat-generating component. In some embodiments, the at least one component comprises a heat-generating component. In some embodiments, the chassis comprises a main fan for generating a main airflow in a main airflow direction from an intake to a vent. In some embodiments, the heat exchanger comprises a first heat sink coupled to a first portion of a set of heat pipes, a first fan for generating a first airflow in a first direction through the first heat sink, a second heat sink coupled to a second portion of the set of heat pipes and a second fan for generating a second airflow in a second direction through the second heat sink. In some embodiments, the first heat sink is separated from the second heat sink by a gap with a distance configured to thermally isolate the first heat sink and the second heat sink. In some embodiments, the first direction is opposite the second direction.

In some embodiments, the first fan and the second fan are proximate the gap. In some embodiments, the first heat sink and the second heat sink are proximate the gap. In some embodiments, the first fan and the second fan draw air in from the gap. In some embodiments, the first fan and the second fan draw exhaust air into the gap. In some embodiments, the first portion of the set of heat pipes extend in the first direction and the second portion of the set of heat pipes extend in the second direction.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
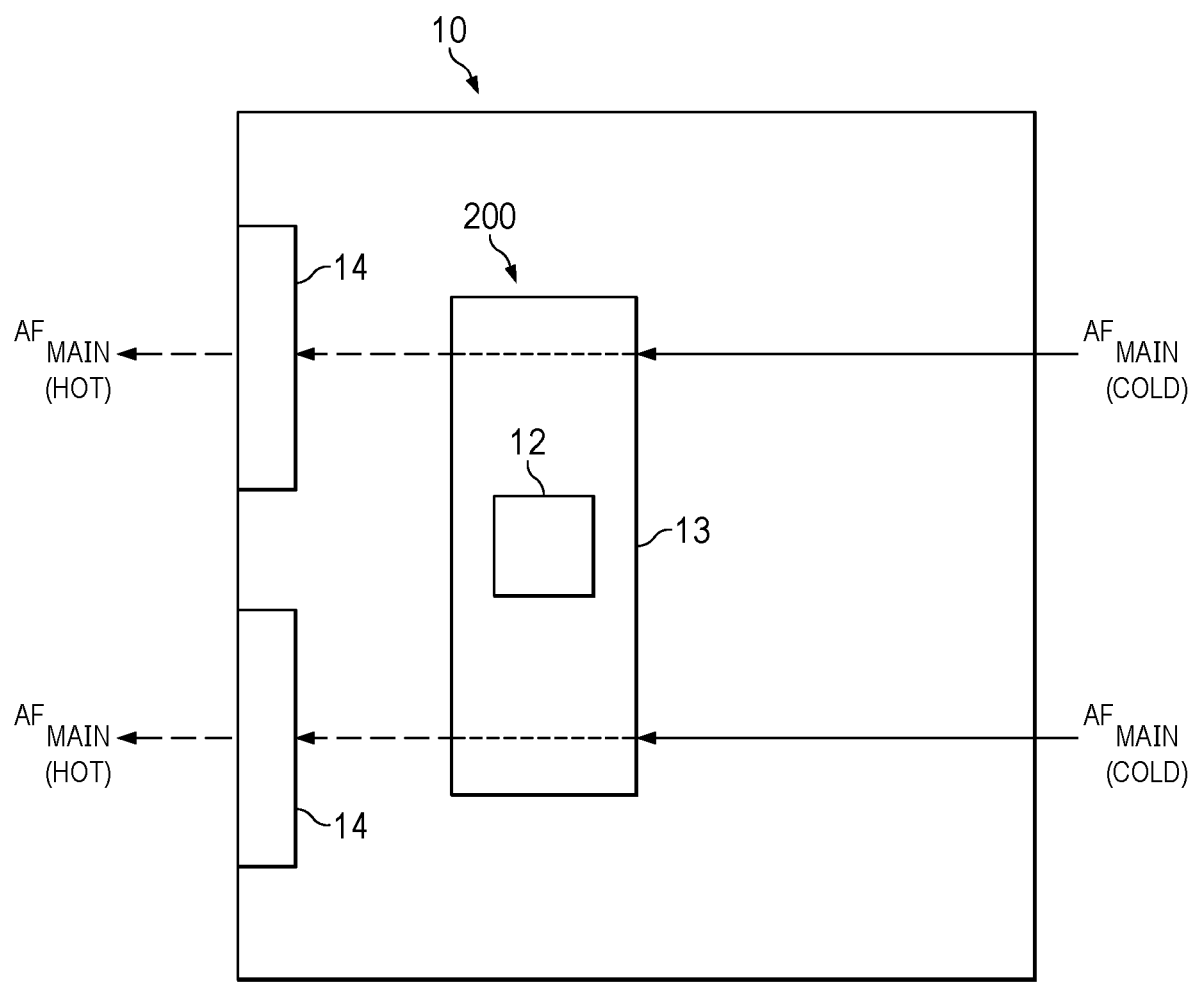
FIG. 1 illustrates an example of an information handling system with a set of main fans generating a main airflow through a chassis to cool a set of components including at least one heat-generating component.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, An IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and a network interface may be communicatively coupled to a processor.

In one or more embodiments, one or more of volatile memory medium, non-volatile memory media, I/O subsystem, and a network interface may be communicatively coupled to a processor via one or more buses, one or more switches, and/or one or more root complexes, among others. In one example, one or more of volatile memory medium, non-volatile memory media, I/O subsystem, and a network interface may be communicatively coupled to a processor via one or more PCI-Express (PCIe) root complexes. In another example, one or more of I/O subsystem and a network interface may be communicatively coupled to a processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium may include volatile storage such as, for example, RAM, DRAM (dynamic RAM), EDO RAM (extended data out RAM), SRAM (static RAM), etc. One or more non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, a network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more of memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of AN IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS), and applications (APPs). In one or more embodiments, one or more of an OS and one or more APPs may include processor instructions executable by a processor. In one example, a processor may execute processor instructions of one or more of an OS and APPs via non-volatile memory medium. In another example, one or more portions of the processor instructions of the one or more of an OS and APPs may be transferred to volatile a memory medium, and a processor may execute the one or more portions of the processor instructions of the one or more of an OS and APPs via volatile a memory medium.

A non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via a non-volatile memory medium. In another instance, one or more portions of the processor instructions of IHSFW may be transferred to volatile memory medium, and a processor may execute the one or more portions of the processor instructions of IHSFW via the volatile memory medium.

In one or more embodiments, a processor and one or more components of an IHS may be included in a system-on-chip (SoC). For example, the SoC may include a processor and a platform controller hub (not specifically illustrated).

Turning to the drawings, FIG. 1 illustrates an example of an information handling system with a set of main fans 14 generating main airflows ($AF_{MAIN}$) through an intake (not shown) in chassis 10 to cool a set of components including at least one heat-generating component 12 before exiting a vent (not shown).

Figure 2:
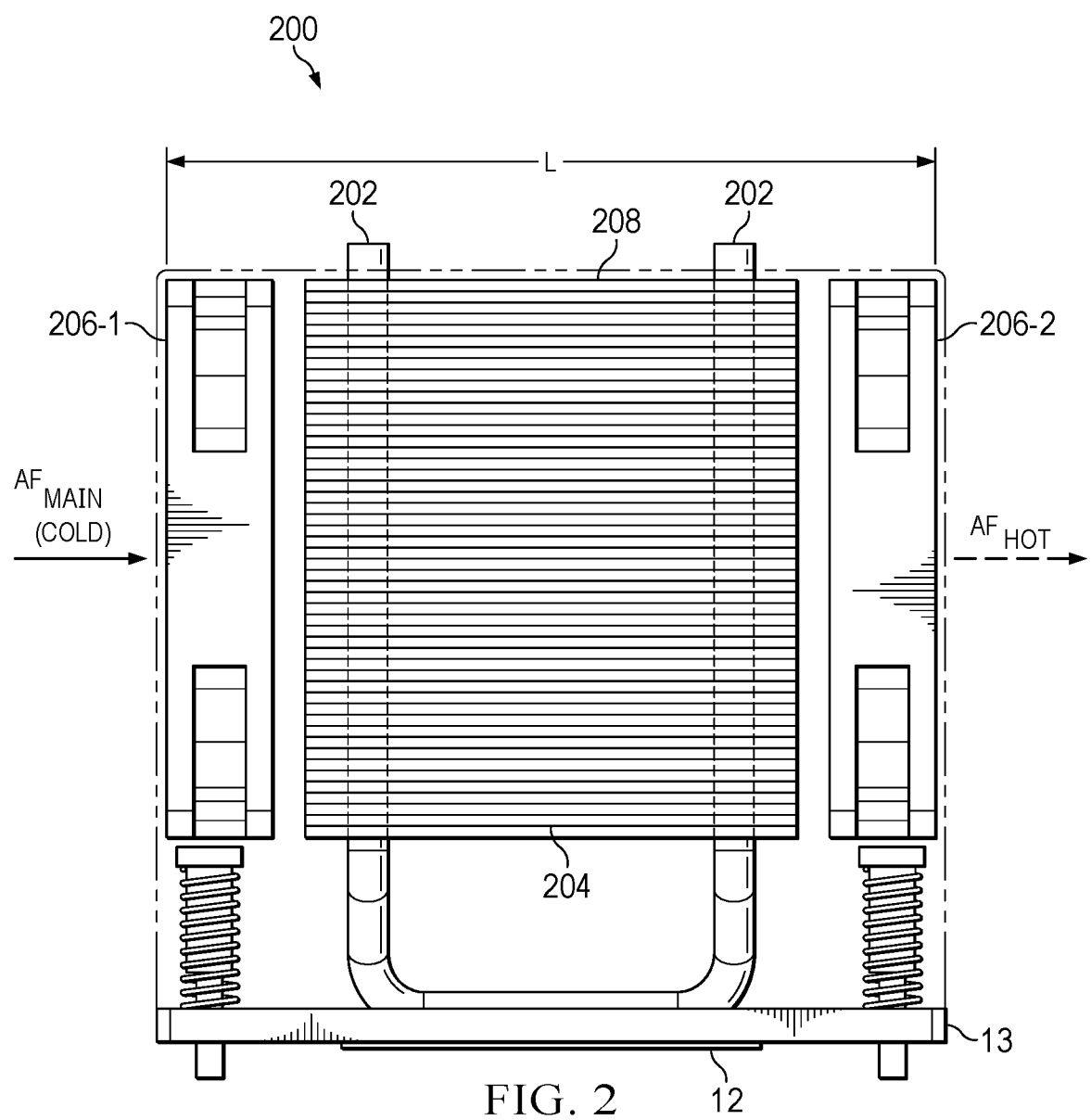
FIG. 2 depicts a side view of one example of a heat exchanger with a single heat sink for cooling at least one heat-generating component.

FIG. 2 depicts a side view of one example of a heat exchanger 200 comprising a set of heat pipes 202 with a single heat sink 208 positioned between fans 206-1 and 206-2 generating a serial airflow through heat sink 208 for cooling heat-generating component 12. Heat exchanger 200 may have an overall length (L) and a plurality of fins in heat sink 208, wherein the number of fins 208 may be selected to optimize the cooling capability of heat exchanger 200.

Figure 3:
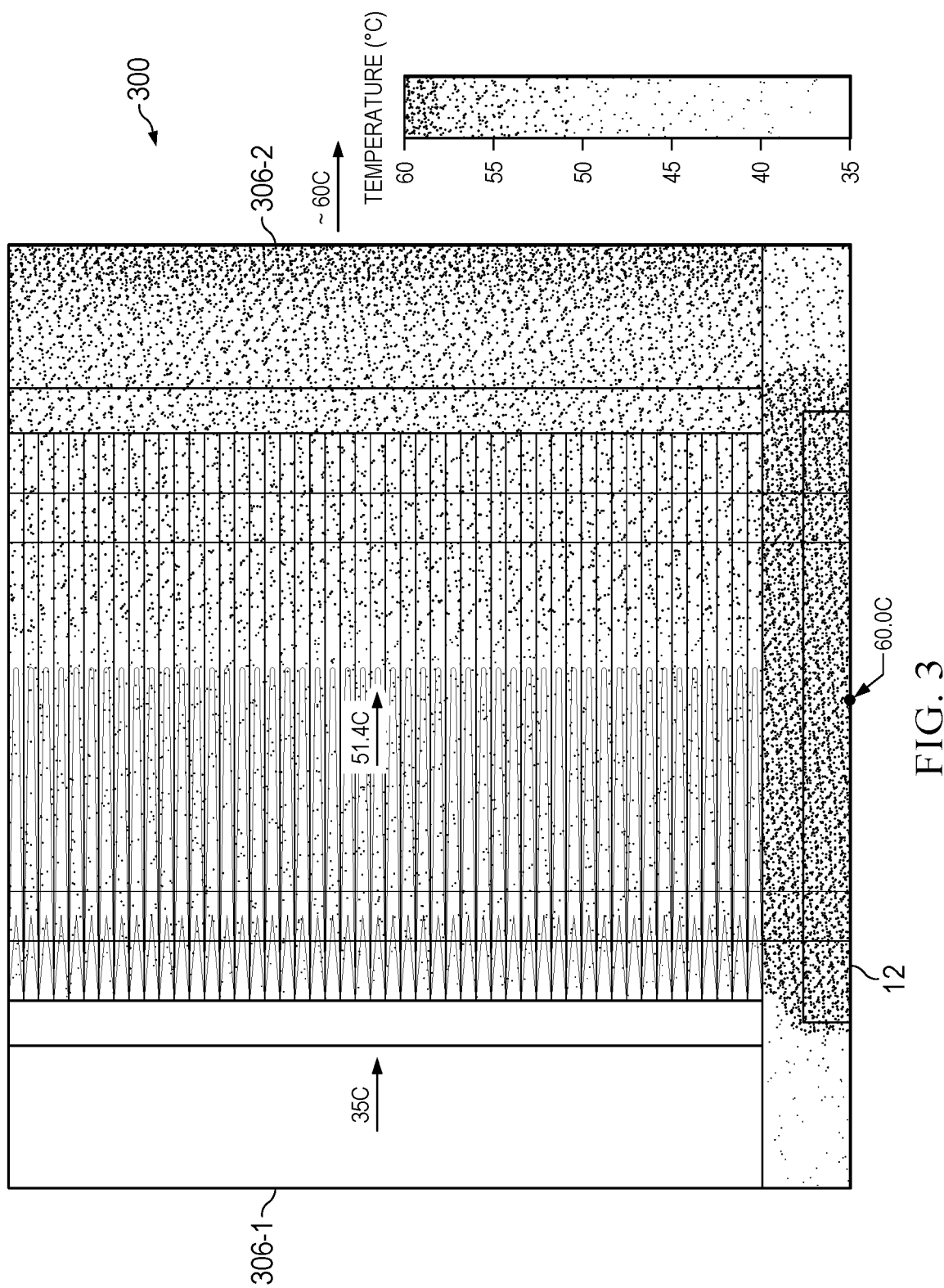
FIG. 3 depicts a simulated temperature profile of the heat exchanger depicted in FIG. 2.

FIG. 3 depicts a simulated temperature profile 300 of heat exchanger 200 depicted in FIG. 2. Heat-generating component 12 may be generating heat such that a component temperature may reach 60 C). Main airflow ($AF_{MAIN}$) may enter heat sink 208 from a first side 306-1 at a first temperature (e.g., 35 C) and a single heated airflow ($AF_{HOT}$) may exit a second side 306-2 at a second temperature approximately equal to the component temperature. At approximately the midpoint of heat sink 208, the temperature may reach a steady state temperature of approximately 51.4 C, resulting in approximately half of heat sink 208 providing little cooling benefit.

Noise Generation

In computer simulations, each fan 206 operating at approximately 3172 rpm generated 26.8 dB such that heat exchanger 200 generated 29.8 dB of noise. Increasing fan speed to reduce an operating temperature may result in higher noise production, discussed in more detail below.

To increase the cooling capability of a heat exchanger without increasing the overall dimensions or increasing the noise produced by the fan(s), in one or more embodiments, a heat exchanger may comprise a first heat sink coupled to a first portion of a set of heat pipes, a first fan for generating a first airflow in a first direction through the first heat sink, a second heat sink coupled to a second portion of the set of heat pipes and a second fan for generating a second airflow in a second direction through the second heat sink, wherein the first heat sink is separated from the second heat sink by a gap with a distance configured to thermally isolate the first heat sink and the second heat sink and the first airflow flows in a direction opposite the direction of the second airflow. The set of heat pipes may be thermally connected to a heat-generating component, with a first portion extending in a first direction and a second portion extending in an opposite direction.

For comparison purposes, all heat exchangers 200, 400, 600, 700, 800, 900 and 1000 are depicted with substantially the same overall dimensions, including height (e.g., 80 mm), width (e.g., 80 mm) and length (L) (e.g., 100 mm). As described later, performance simulations of each of heat exchangers 200, 400, 600, 700, 800, 900 and 1000 were based on an optimized number of copper fins in a heat sink (e.g., single heat sink 208 in FIG. 2 or heat sink 704 in FIG. 7) or in each heat sink in a pair of heat sinks (e.g., heat sinks 304 in FIG. 4, heat sinks 604 in FIG. 6, heat sinks 804 in FIG. 8, heat sinks 904 in FIG. 9 and heat sinks 1004 in FIG. 10) to cool a component operating at 205 W, with heat pipes 202 having the same heat transfer capacity (K) and same ambient temperature (35 C). Each heat exchanger 200, 400, 600, 700, 800, 900 and 1000 comprises one or more fans 206 having the same performance capabilities.

Thermal Isolation of Heat Sinks and Opposed Airflows

Figure 4:
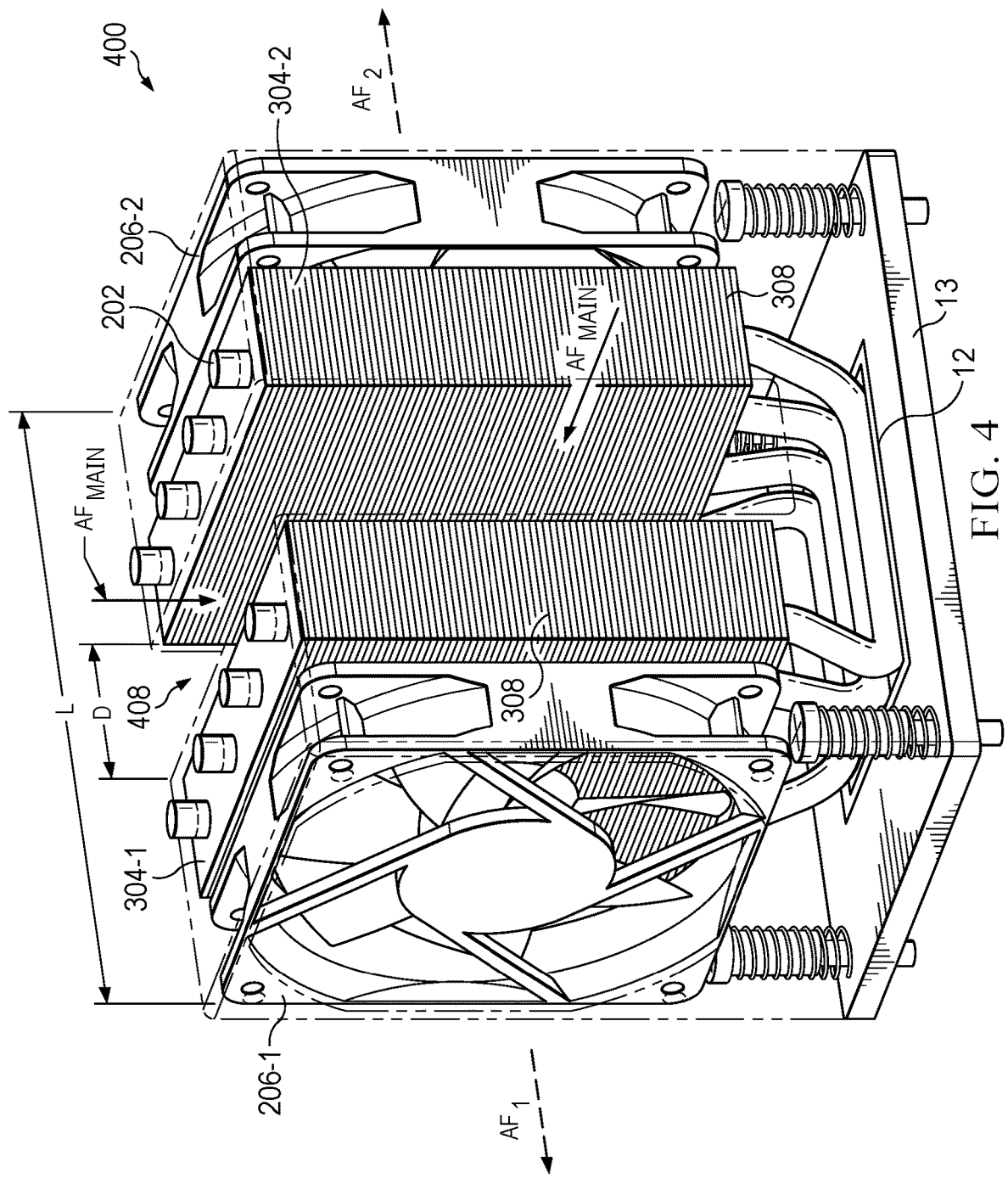
FIG. 4 depicts a perspective view of one embodiment of a heat exchanger with two thermally isolated heat sinks and two fans generating airflows in opposite directions.

FIG. 4 depicts a perspective view of one embodiment of a heat exchanger with two thermally isolated heat sinks 304 and two fans 206 generating airflows in opposite directions. Heat exchanger 400 may comprise a first heat sink 304-1 coupled to a first portion of a set of heat pipes 202 and second heat sink 304-2 coupled to a second portion of the set of heat pipes 202, wherein first heat sink 304-1 is separated from second heat sink 304-2 by a gap 408 with a distance (D) configured to thermally isolate first heat sink 304-1 and second heat sink 304-2.

Thermal isolation may refer to the positioning and/or orientation of first heat sink 304-1 and second heat sink 304-2 such that a first airflow (AF$_1$) exiting first heat sink 304-1 does not enter second heat sink 304-2 and a second airflow (AF$_2$) exiting second heat sink 304-2 does not enter first heat sink 304-1.

Heat exchanger 400 may further comprise first fan 206-1 for generating first airflow (AF$_1$) in a first direction through first heat sink 304-1 and second fan 206-2 for generating second airflow (AF$_2$) in a second direction through second heat sink 304-2, wherein the first direction is opposite the second direction. Fans 206 may be positioned relative to heat sinks 304 and oriented to draw main airflow (AF$_{MAIN}$) from gap 408 into heat sinks 304 or oriented to exhaust heated airflow into gap 408. As depicted in FIG. 4, fans 206 draw air into heat sinks 304 via gap 408 and exhaust a first heated airflow (AF$_1$) out first heat sink 304-1 and a second heated airflow (AF$_2$) out second heat sink 304-2.

In some embodiments, heat exchanger 400 may be positioned in chassis 10 and oriented such that each of the first airflow (AF$_1$) and the second airflow (AF$_2$) are substantially perpendicular to a direction of a main airflow (AF$_{MAIN}$).

Figure 5:
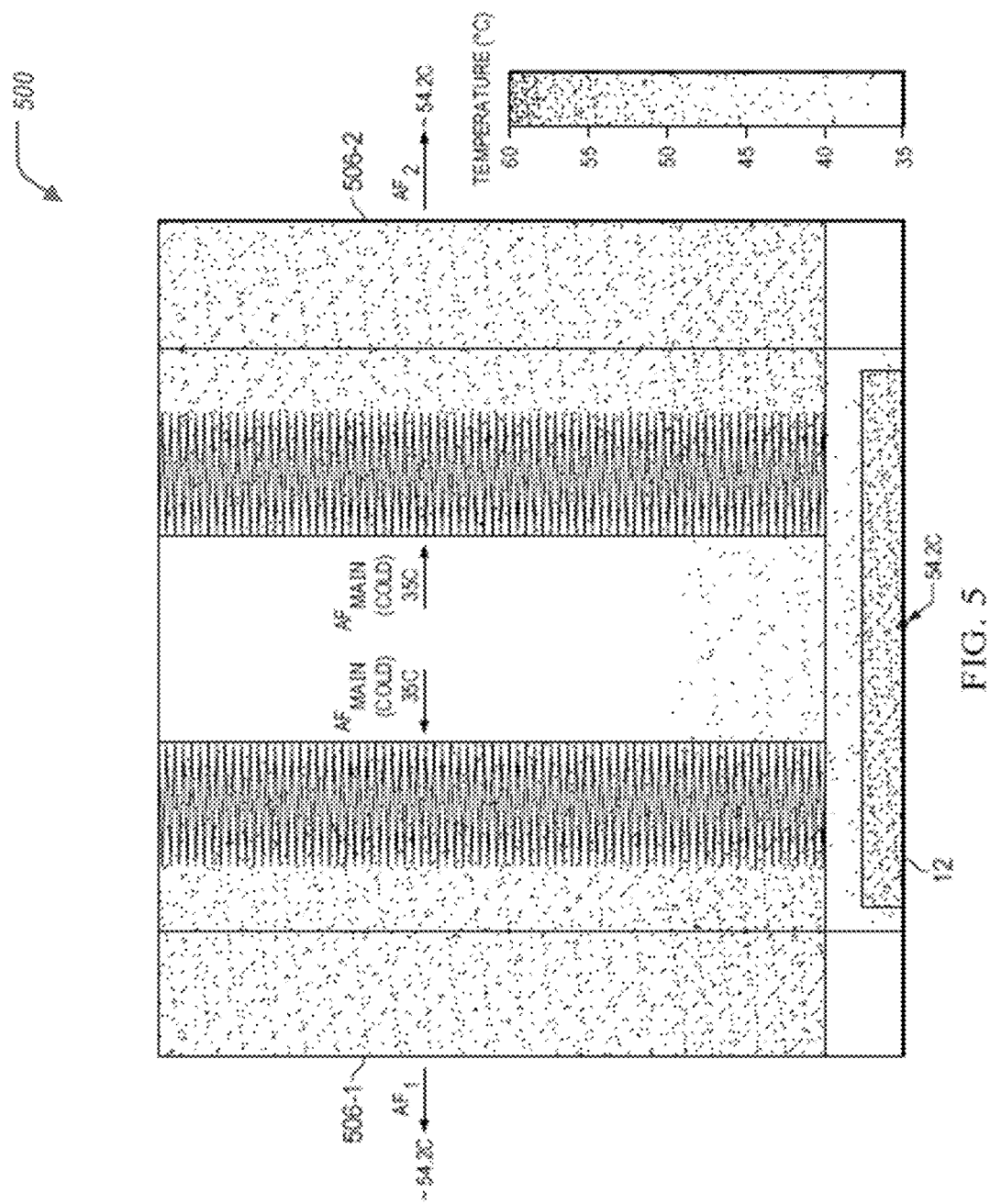
FIG. 5 depicts a simulated temperature profile of the embodiment of a heat exchanger depicted in FIG. 4.

FIG. 5 depicts a simulated temperature profile 500 of heat exchanger 400 depicted in FIG. 4 with two heat sinks 304-1 and 304-2 separated by a gap 408 and fans 206 generating two airflows (AF$_1$ and AF$_2$) in opposite directions. Main airflow (AF$_{MAIN}$) may enter gap 408 between first and second heat sinks 304 such that main airflow (AF$_{MAIN}$) enters each heat sink 304-1, 304-2 at a first temperature (e.g., 35 C) and first airflow (AF$_1$) may exit side 506-1 at a temperature of approximately 54.2 C and second airflow (AF$_2$) may exit side 506-2 at a temperature at a temperature of approximately 54.2 C. Comparing performance of heat exchanger 400 with the example heat exchanger 200 depicted in FIG. 2, both heat exchangers 200, 400 may operate at the same fan speed (e.g., approximately 3172 rpm) and produce the same amount of noise (e.g., 26 dB for each fan 206 or 29.8 dB as a module). However, heat exchanger 400 may cool component 12 to approximately 54.5 C, which is approximately 5.5 C cooler than heat exchanger 200 can cool the same component 12, resulting in an approximately 21% improvement in cooling performance.

Improved Performance Over Heat Exchangers

Figure 6:
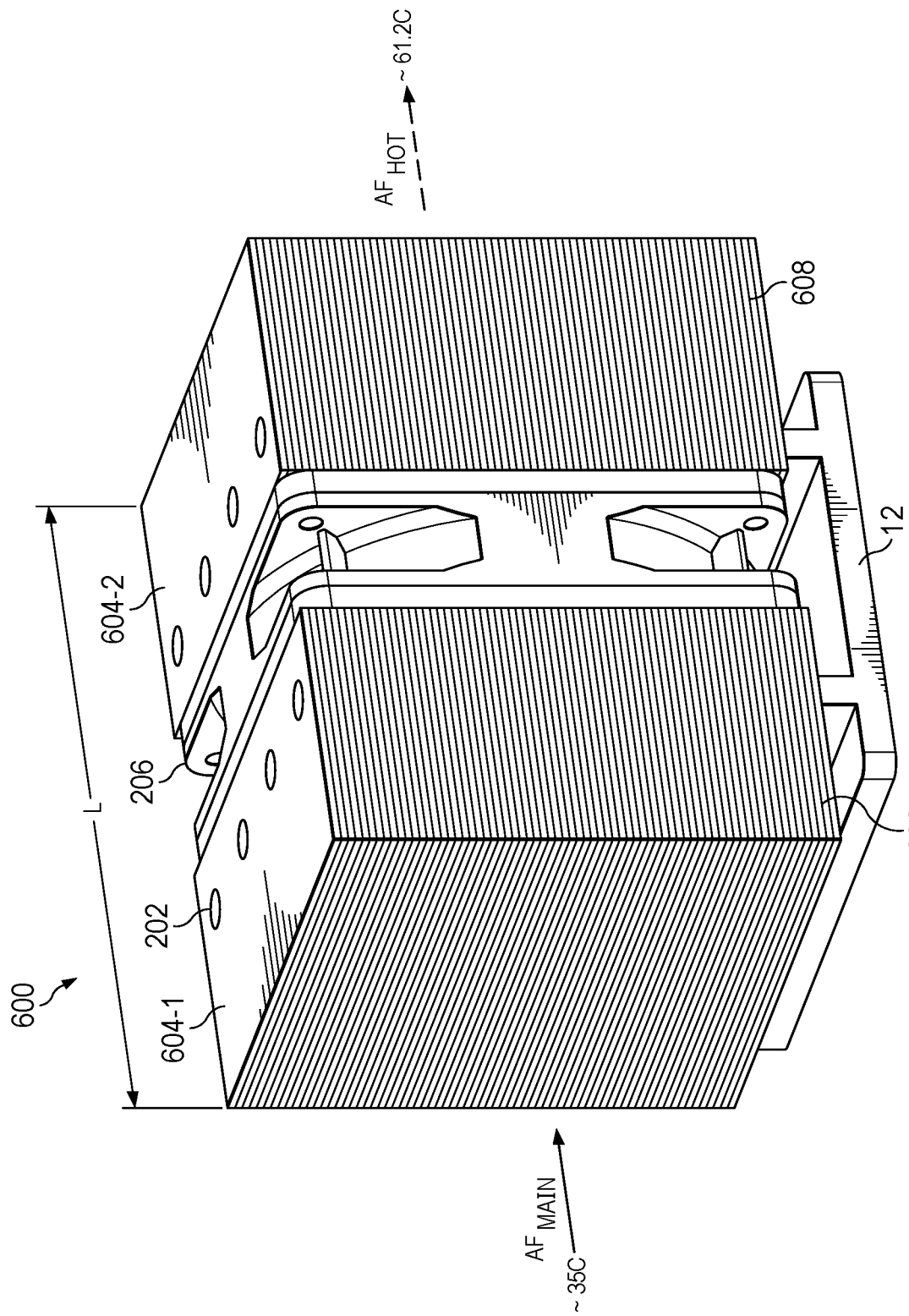
FIG. 6 depicts a perspective view of a heat exchanger with two heat sinks in series.

FIG. 6 depicts a perspective view of an example heat exchanger 600 having length L with a single fan 206 positioned between and in contact with heat sinks 604-1 and 604-2 arranged in series. As depicted in FIG. 6, main airflow (AF$_{MAIN}$) may enter heat sink 604-1 at approximately 35 C but fan 206 ensures all airflow exits through second heat sink 604-2, wherein the temperature of the heated airflow (AF$_{HOT}$) may be between approximately 61.2 C and 62.5 C depending on the number and spacing of fins 608 in heat sinks 604. Comparing performance of heat exchanger 400 with heat exchanger 600 depicted in FIG. 6, both heat exchangers 400, 600 may operate at the same fan speed (e.g., approximately 3172 rpm) and produce the same amount of noise (e.g., 29 dB as a module). However, heat exchanger 400 may cool component 12 to approximately 54.5 C, which is approximately 5.5 C cooler than heat exchanger 600 can cool component 12, resulting in an approximately 21% improvement in cooling performance.

Figure 7:
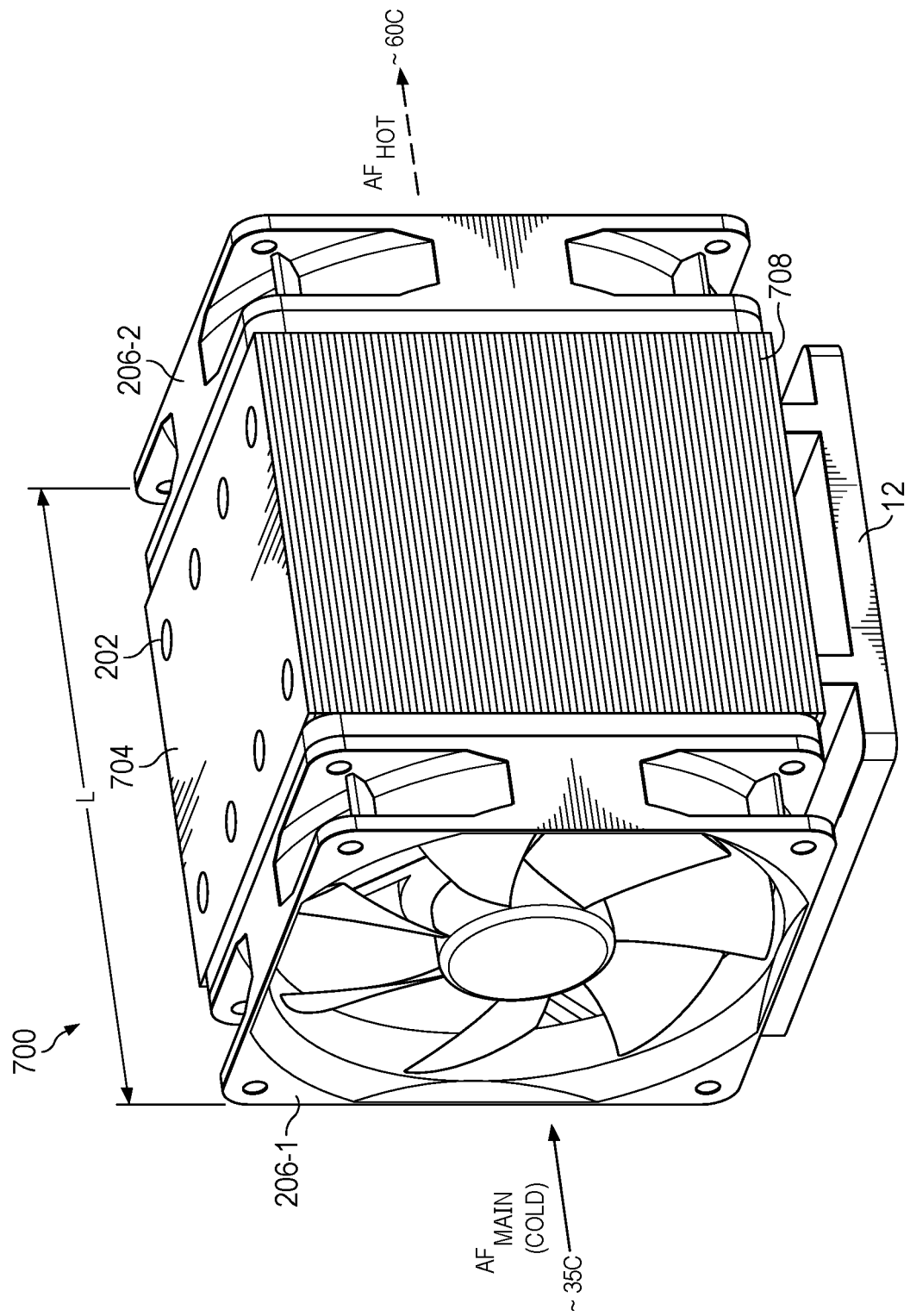
FIG. 7 depicts a perspective view of a heat exchanger with two fans generating two airflows in series.

FIG. 7 depicts a perspective view of a heat exchanger 700 having length L with two fans 206 generating a single airflow through heat sink 704. As depicted in FIG. 7 main airflow (AF$_{MAIN}$) at a first temperature (e.g., 35 C) may enter heat exchanger 700 through first fan 206-1 and flow through a single heat sink 704 before a heated airflow (AF$_{HOT}$) exits second fan 206-2 at a second temperature between approximately 60.1 and 60.8 C depending on the number and spacing of fins 708. Comparing performance of heat exchanger 400 with heat exchanger 700 depicted in FIG. 7, both heat exchangers 400, 700 may operate at the same fan speed (e.g., approximately 3172 rpm) and produce the same amount of noise (e.g., 26 dB for each fan 206 and 29 dB as a module). Heat exchanger 400 may cool component 12 to approximately 54.5 C, which is approximately 5 C cooler than heat exchanger 700 can cool the same component 12, resulting in an approximately 18% improvement in cooling performance.

Figure 8:
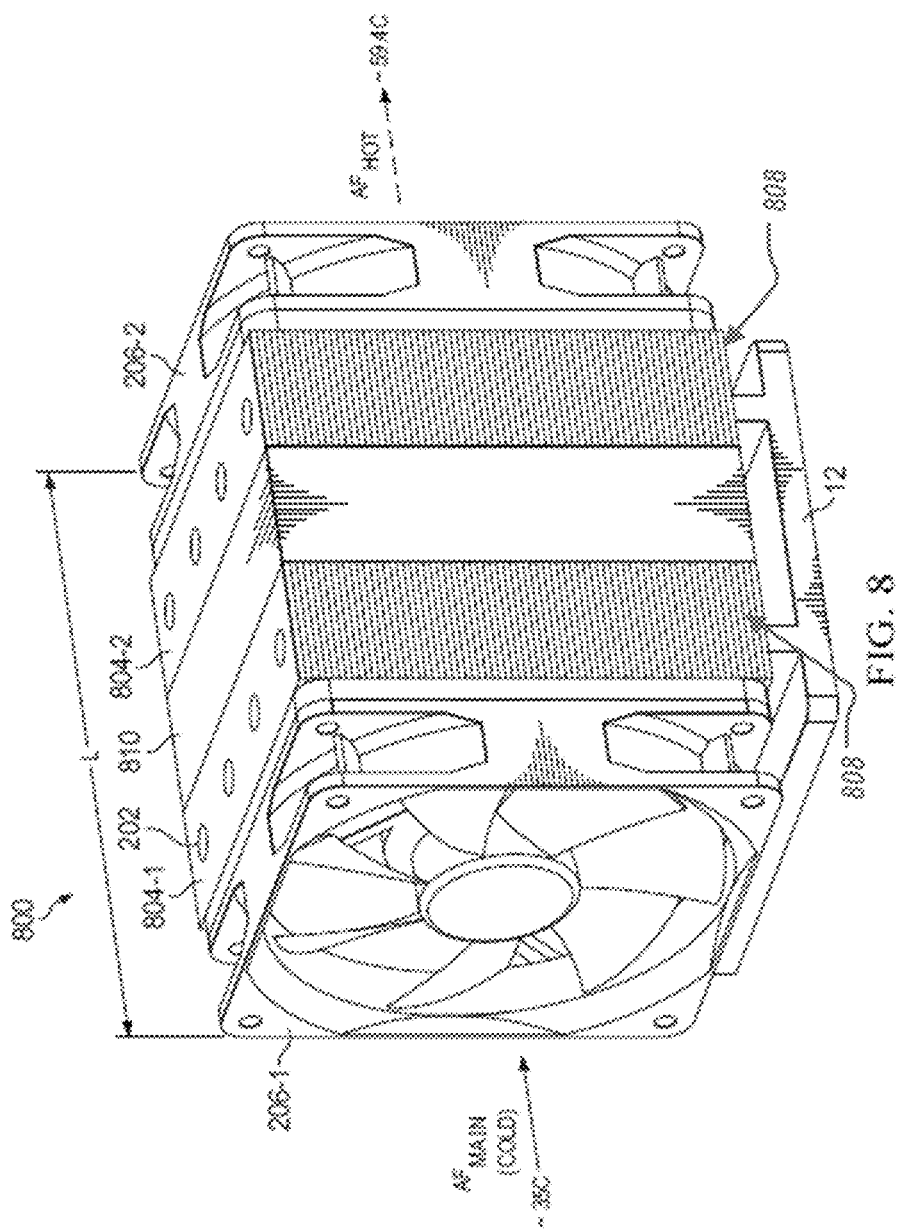
FIG. 8 depicts a perspective view of a heat exchanger with two heat sinks and two fans generating two airflows in series.

FIG. 8 depicts a perspective view of a heat exchanger 800 having length L with two fans 206 generating a single airflow through two heat sinks 804 thermally coupled by a casing having a center cut 810. As depicted in FIG. 8 main airflow ($AF_{MAIN}$) at a first temperature (e.g., 35 C) may enter heat exchanger 800 through first fan 206-1 and flow through heat sinks 804-1 and 804-2 arranged in series. The casing may channel the heated airflow from first heat sink 804-1 into second heat sink 804-2, wherein center cut 810 may allow some main airflow ($AF_{MAIN}$) to enter second heat sink 804-2.

The heated airflow exiting first heat sink 804-1 may combine with a portion of the main airflow ($AF_{MAIN}$) entering through center cut 810 before a single heated airflow ($AF_{HOT}$) exits second fan 206-2 at a second temperature between approximately 59.4 C and 60.6 C depending on the number and spacing of fins 808. Comparing performance of heat exchanger 400 with heat exchanger 800 depicted in FIG. 8, both heat exchangers 400, 800 may operate at the same fan speed (e.g., approximately 3172 rpm) and produce the same amount of noise (e.g., 26 dB for each fan 206 and 29 dB as a module). Heat exchanger 400 may cool component 12 to approximately 54.5 C, which is approximately 5 C cooler than component 12 cooled by heat exchanger 600. Alternatively, heat exchanger 800 operating at approximately 4331 rpm may be able to cool component 12 to approximately 54 C but may produce approximately 36.6 dB of noise as a result.

Alternate Configurations

Figure 9:
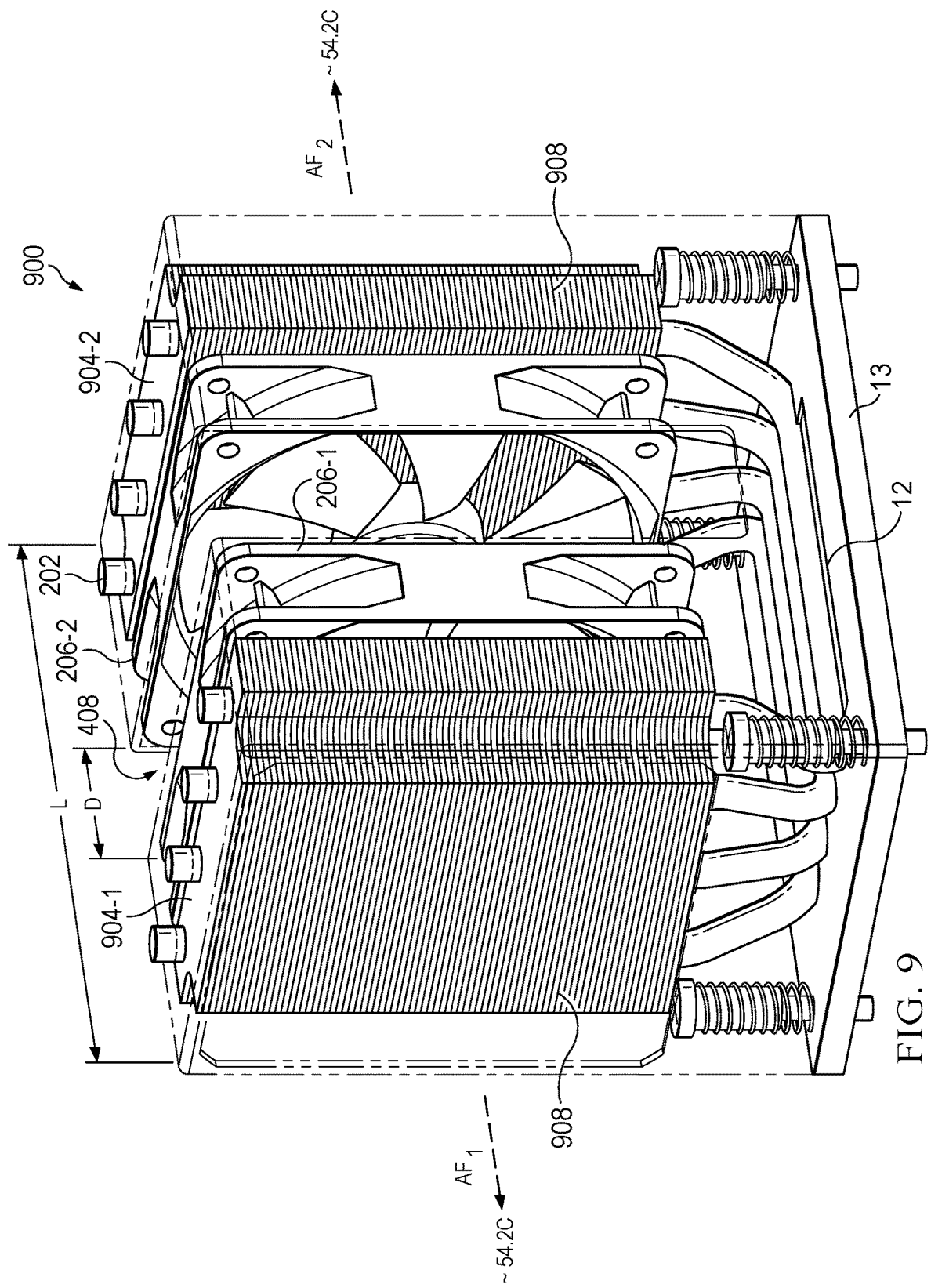
FIG. 9 depicts a perspective view of one embodiment of a heat exchanger for cooling at least one heat-generating component.

FIG. 9 depicts a perspective view of one embodiment of a heat exchanger with two thermally isolated heat sinks and two fans 206 generating airflows in opposite directions. Heat exchanger 900 may comprise a first heat sink 904-1 coupled to a first portion of a set of heat pipes 202, first fan 206-1 for generating a first airflow ($AF_1$) in a first direction through first heat sink 904-1, second heat sink 904-2 coupled to a second portion of the set of heat pipes 202, and second fan 206-2 for generating a second airflow ($AF_2$) in a second direction through second heat sink 304-2. First fan 206-1 and second fan 206-2 may be proximate gap 408. First fan 206-1 may be separated from second fan 206-2 by distance (D) configured to thermally isolate first heat sink 904-1 and second heat sink 904-2. The direction of first airflow ($AF_1$) may be opposite the direction of second airflow ($AF_2$). Heat exchanger 900 may be positioned in chassis 10 relative to a heat-generating component 12 or base 13 containing heat-generating component 12 and oriented such that each of the first airflow ($AF_1$) and the second airflow ($AF_2$) are substantially perpendicular to a main airflow ($AF_{MAIN}$).

Figure 10:
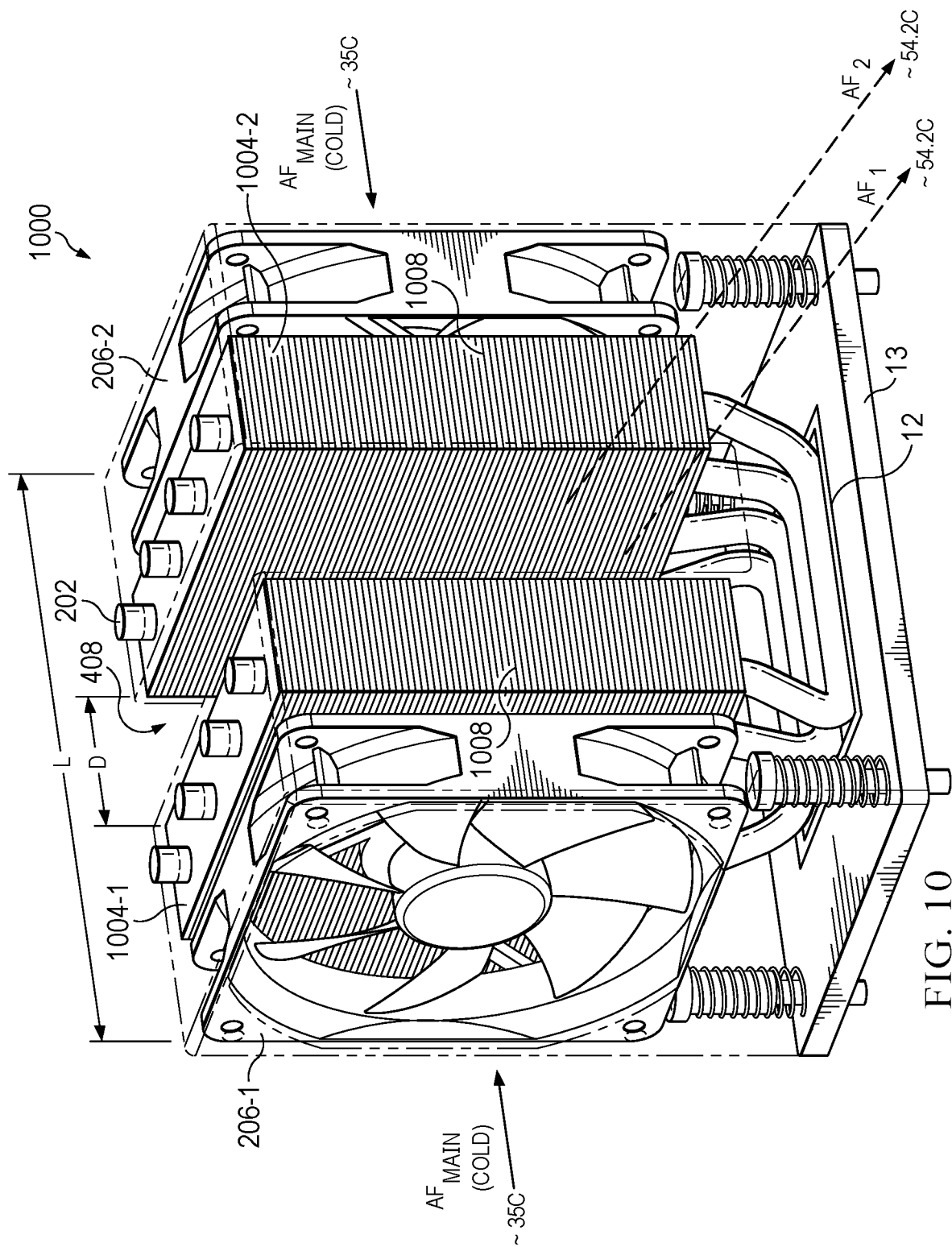
FIG. 10 depicts a perspective view of one embodiment of a heat exchanger for cooling at least one heat-generating component.

FIG. 10 depicts a perspective view of one embodiment of a heat exchanger with two thermally isolated heat sinks 1004 and two fans 206 generating airflows in opposite directions. Heat exchanger 1000 may comprise a first heat sink 1004-1 coupled to a first portion of a set of heat pipes 202, first fan 206-1 for generating a first airflow ($AF_1$) in a first direction through first heat sink 1004-1, second heat sink 1004-2 coupled to a second portion of the set of heat pipes 202, and second fan 206-2 for generating a second airflow ($AF_2$) in a second direction through second heat sink 1004-2. First heat sink 1004-1 and second heat sink 1004-2 may be proximate gap 408, wherein first airflow ($AF_1$) contains heat exhausted by first heat sink 1004-1 into gap 408 and second airflow ($AF_2$) contains heat exhausted by second heat sink 1004-1 into gap 408. First heat sink 1004-1 may be separated from second heat sink 1004-2 by distance (D) configured to thermally isolate first heat sink 1004-1 and second heat sink 1004-2. The direction of first airflow ($AF_1$) is opposite the direction of second airflow ($AF_2$). Heat exchanger 1000 may be positioned in chassis 10 relative to a heat-generating component 12 or base 13 containing heat-generating component 12 and oriented such that each of the first airflow ($AF_1$) and the second airflow ($AF_2$) are substantially perpendicular to a main airflow ($AF_{MAIN}$). Although first heat sink 1004-1 and second heat sink 1004-2 are positioned proximate gap 1008 and fans 206 generate two airflows ($AF_1$ and $AF_2$) towards each other, fans 206 may generate airflows ($AF_1$ and $AF_2$) with low pressure and gap 1008 may allow main airflow ($AF_{MAIN}$) to flow between first heat sink 1004-1 and second heat sink 1004-2 such that first heat sink 1004-1 and second heat sink 1004-2 may be thermally isolated.

Figure 11:
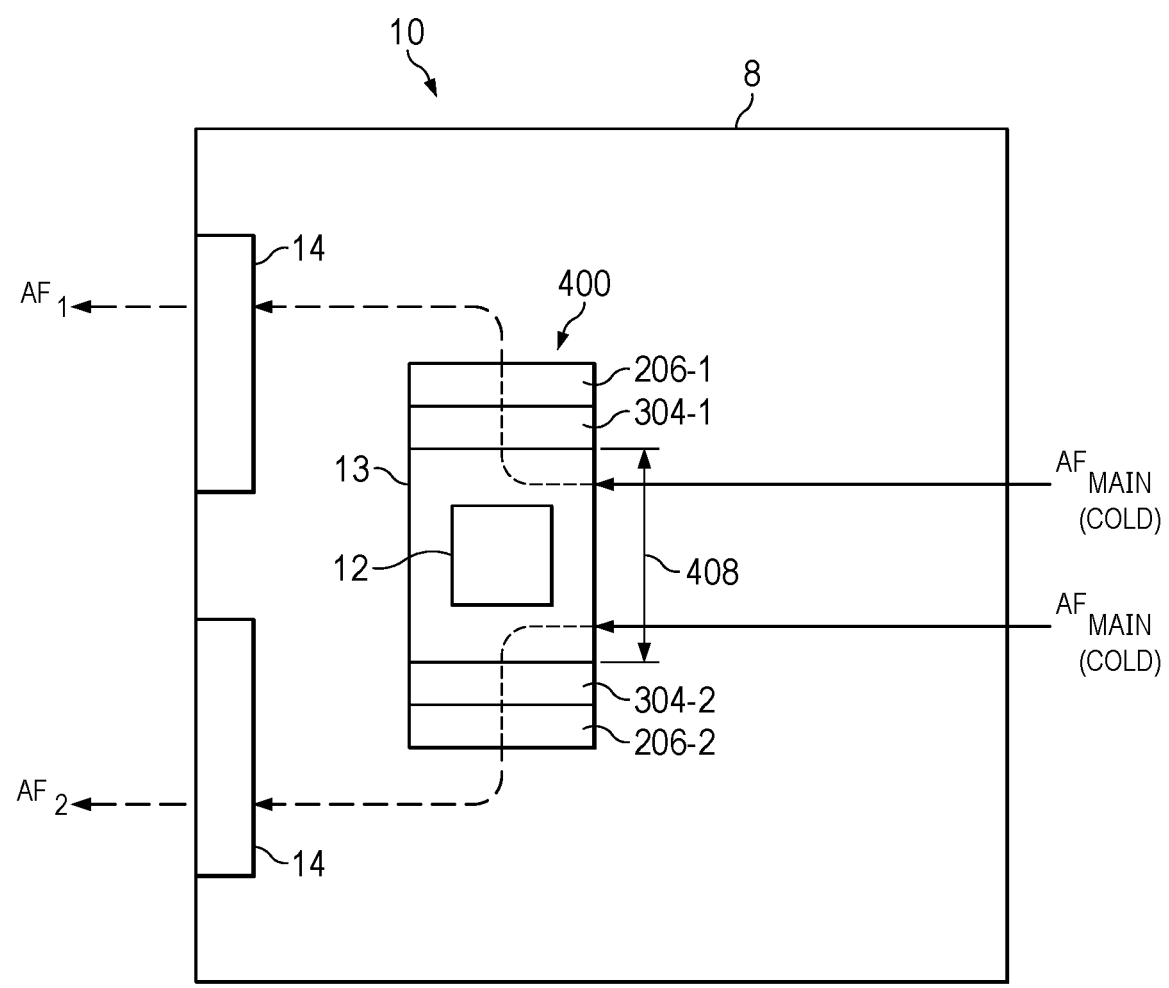
FIG. 11 illustrates an example of an information handling system with a set of main fans generating a main airflow through a chassis to cool a set of components including at least one heat-generating component and one embodiment of a heat exchanger with two thermally isolated heat sinks and two fans generating airflows in opposite directions and perpendicular to the main airflow.

FIG. 11 illustrates an example of an information handling system with a set of main fans 14 generating a main airflow ($AF_{MAIN}$) through chassis 8 to cool a set of components including at least one heat-generating component 12 on a base 13 and one embodiment of a heat exchanger 400 with two thermally isolated heat sinks 304 and two fans 206 generating two airflows ($AF_1$ and $AF_2$), wherein heat sinks 304-1 and 304-2 may be separated by gap 408 and airflows ($AF_1$ and $AF_2$) may exit heat exchanger 44 in substantially opposite directions and perpendicular to the main airflow ($AF_{MAIN}$).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A heat exchanger, comprising:
 a first heat sink coupled to a first portion of a set of heat pipes, the first heat sink having a plurality of first fins;
 a first fan for generating a first airflow in a first direction through the plurality of first fins of the first heat sink, the first fan directly attached to the first heat sink;
 a second heat sink coupled to a second portion of the set of heat pipes, the second heat sink having a plurality of second fins; and
 a second fan for generating a second airflow in a second direction through the plurality of second fins of the second heat sink, the second fan directly attached to the second heat sink, wherein the first direction is opposite the second direction,
 wherein the first heat sink and the second heat sink are positioned to define a gap extending completely between the first heat sink and the second heat sink such that the first fan and the second fan are separated by the first heat sink, the second heat sink, and the gap, and
 wherein the gap between the first heat sink and the second heat sink is empty and thermally isolates the first heat sink from the second heat sink.

2. The heat exchanger of claim 1, wherein the first fan and the second fan draw air in from the gap.

3. The heat exchanger of claim 1, wherein the first fan and the second fan draw exhaust air into the gap.

4. A chassis for an information handling system comprising at least one heat-generating component, the chassis comprising:
 a main fan for generating a main airflow in a main airflow direction from an intake to a vent; and a heat exchanger for cooling the at least one heat-generating component, the heat exchanger comprising:
  a first heat sink coupled to a first portion of a set of heat pipes, the first heat sink having a plurality of first fins;
  a first fan for generating a first airflow in a first direction through the plurality of first fins of the first heat sink, the first fan directly attached to the first heat sink;
  a second heat sink coupled to a second portion of the set of heat pipes, the second heat sink having a plurality of second fins; and
  a second fan for generating a second airflow in a second direction through the plurality of second fins of the second heat sink, the second fan directly attached to the second heat sink, wherein the first direction is opposite the second direction,
  wherein the first heat sink and the second heat sink are positioned to define a gap extending completely between the first heat sink and the second heat sink such that the first fan and the second fan are separated by the first heat sink, the second heat sink, and the gap, and
  wherein the gap between the first heat sink and the second heat sink is empty and thermally isolates the first heat sink from the second heat sink.

5. The chassis of claim 4, wherein the first fan and the second fan draw air in from the gap.

6. The chassis of claim 4, wherein the first fan and the second fan draw exhaust air into the gap.

7. An information handling system, comprising:
  a chassis having an intake and a vent;
  a plurality of components in the chassis, wherein at least one component of the plurality of components comprises a heat-generating component;
  a main fan for generating a main airflow in a main airflow direction in the chassis; and
  a heat exchanger for cooling the heat-generating component, the heat exchanger comprising:
    a first heat sink coupled to a first portion of a set of heat pipes, the first heat sink having a plurality of first fins;
    a first fan for generating a first airflow in a first direction through the plurality of first fins of the first heat sink, the first fan directly attached to the first heat sink;
    a second heat sink coupled to a second portion of the set of heat pipes, the second heat sink having a plurality of second fins; and
    a second fan for generating a second airflow in a second direction through the plurality of second fins of the second heat sink, the second fan directly attached to the second heat sink, wherein the first direction is opposite the second direction,
    wherein the first heat sink and the second heat sink are positioned to define a gap extending completely between the first heat sink and the second heat sink such that the first fan and the second fan are separated by the first heat sink, the second heat sink, and the gap, wherein the first heat sink is thermally isolated from the second heat sink, and
    wherein the gap between the first heat sink and the second heat sink is empty and thermally isolates the first heat sink from the second heat sink.

8. The information handling system of claim 7, wherein the first fan and the second fan draw air in from the gap.

9. The information handling system of claim 7, wherein the first fan and the second fan draw exhaust air into the gap.

10. The information handling system of claim 7, wherein the heat-generating component comprises a processor.

11. The information handling system of claim 10, wherein the heat-generating component comprises a graphics processing unit (GPU).

* * * * *